United States Patent
Herzog et al.

(10) Patent No.: US 9,051,646 B2
(45) Date of Patent: Jun. 9, 2015

(54) SPUTTERING TARGET HAVING AMORPHOUS AND MICROCRYSTALLINE PORTIONS AND METHOD OF PRODUCING SAME

(75) Inventors: Andreas Herzog, Bruchköbel (DE); Sabine Schneider-Betz, Dreieich (DE); Martin Schlott, Offenbach (DE); Christoph Stahr, Kahl am Main (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 785 days.

(21) Appl. No.: 13/267,407

(22) Filed: Oct. 6, 2011

(65) Prior Publication Data

US 2012/0085641 A1    Apr. 12, 2012

(51) Int. Cl.
   *C23C 14/34*    (2006.01)
   *C04B 35/01*    (2006.01)

(52) U.S. Cl.
   CPC ............. *C23C 14/3414* (2013.01); *C04B 35/01* (2013.01); *C04B 2235/3284* (2013.01); *C04B 2235/3286* (2013.01); *C04B 2235/6562* (2013.01); *C04B 2235/6565* (2013.01); *C04B 2235/6567* (2013.01)

(58) Field of Classification Search
   CPC ............ C23C 14/3407; C23C 14/3414; H01J 37/3414; H01J 37/3426; C04B 35/01; C04B 2235/3284; C04B 2235/3286; C04B 2235/6562; C04B 2235/6565; C04B 2235/6567
   USPC .............. 204/298.12, 298.13, 298.21, 298.22
   See application file for complete search history.

(56) References Cited

U.S. PATENT DOCUMENTS

2011/0079511 A1 * 4/2011 Hellmich et al. ......... 204/298.13
2011/0306165 A1 * 12/2011 Ikisawa et al. ............. 438/104

FOREIGN PATENT DOCUMENTS

| EP | 1422312 A1 | 5/2004 |
| EP | 2096188 A1 | 9/2009 |
| JP | 2010-202450 A | 9/2010 |
| WO | 2005090631 A1 | 9/2005 |
| WO | WO 2009/084537 | * 7/2009 |

OTHER PUBLICATIONS

Park et al., "Electronic transport properties of amorphous indium-gallium-zinc oxide semiconductor upon exposure to wear", Applied Physics Letters 92, 072104—1-3, (Jul. 2008).*
Office Action issued Jun. 7, 2011 in DE Application No. 102010047756.7.
Pecharsky et al, "Fundamentals of Powder Diffraction and Structural Characterization of Materials," Second Edition, Springer, pp. 377-399 (2009).
Madsen et al, "Quantitative Phase Analysis," Powder Diffraction, Theory, and Practice, ed. Royal Society of Chemistry, pp. 298-331 (2008).
Scardi, "Microstructural Properties: Lattice Defects and Domain Size Effects," Powder Diffraction, Theory, and Practice, ed. Royal Society of Chemistry, pp. 376-413 (2008).
English translation of an Office Action issued Dec. 1, 2014 in JP Application No. 2011-222871.

* cited by examiner

*Primary Examiner* — Rodney McDonald
(74) *Attorney, Agent, or Firm* — Panitch Schwarze Belisario & Nadel LLP

(57) ABSTRACT

A sputtering target is provided which ensures the production of unvaryingly homogenous layers of the sputtering material during the lifespan of the sputtering target. The sputtering target includes a mixture of oxides of indium, zinc, and gallium, the mixture containing at least one ternary mixed oxide of indium, zinc, and gallium and at least one amorphous phase. The portion of ternary mixed oxides of indium, zinc, and gallium is at least 50 weight percent, relative to the total weight of the mixture, and the portion of amorphous phase is at least 20 weight percent, relative to the total weight of the mixture.

4 Claims, No Drawings

SPUTTERING TARGET HAVING AMORPHOUS AND MICROCRYSTALLINE PORTIONS AND METHOD OF PRODUCING SAME

BACKGROUND OF THE INVENTION

The present invention relates to a sputtering target having a mixture of oxides of indium, gallium, and zinc, and to a method for producing such a sputtering target.

Liquid crystal displays (LCDs) have long been indispensable in the electronics industry, and active-matrix displays have in particular enjoyed great popularity. For controlling, such active-matrix displays contain a matrix of thin-film transistors (TFTs), for whose manufacture it is necessary to produce thin layers of an active semiconductor. Amorphous silicon is conventionally used here as a semiconductor material. However, layers of amorphous silicon are characterized by relatively low charge carrier mobility.

For this reason, improved semiconductor materials are constantly being sought. In particular, materials from the group of the oxide semiconductors have turned out to be highly promising alternatives to amorphous silicon. Above all, mixed oxides of indium, gallium, and zinc exhibit properties that in many respects are improved compared to amorphous silicon. For example, layers of indium-gallium-zinc oxides have a very high charge carrier mobility of 10-50 $Vs/m^2$, and are therefore better by orders of magnitude than the layers of amorphous silicon currently used in TFT-LCD displays. Moreover, indium-gallium-zinc oxides have a charge carrier concentration that is suitable for use in transistors. Their good semiconductor properties in connection with high transparency give these materials a number of attractive possible uses. For example, indium-gallium-zinc oxides can be used to produce thin-film transistors for LCD displays having a high switching frequency, or for organic light emitting diodes (OLEDs), which, as an emissive technology, require a current drive. In addition, the use of indium-gallium-zinc oxides enables an enlargement of the effective pixel surface, because the manufactured transistor is transparent.

The layers of the active semiconductor required for the production of thin-film transistors are conventionally applied by sputter deposition (sputtering). In sputtering, atoms or compounds are detached from a solid body, the sputtering target, through bombardment with energy-rich ions (conventionally noble gas ions), and go into the gas phase. The atoms or molecules in the gas phase are finally deposited by condensation onto a substrate situated in the vicinity of the sputtering target, where they form a layer.

In sputtering, the problem often occurs that layers of the sputtering material are not deposited homogenously. This problem is also observed with sputtering targets containing indium-gallium-zinc mixed oxides as sputtering material. Thus, during sputtering of these materials small structures, so-called "nodules," often form that impair the homogeneity of the deposited layer.

In order to solve this problem, European patent publication EP 2 096 188 proposes the use of sputtering targets containing oxides of indium, gallium, and zinc, as well as the compounds $ZnGa_2O_4$ and $InGaZnO_4$. To produce these sputtering targets, special powders of indium oxide, gallium oxide, and zinc oxide are mixed, ground to form a powder of raw material, shaped, and finally sintered. With these sputtering targets, the homogeneity of the deposited layers of the sputtering material can in fact be significantly increased.

However, it has been observed that, although at first layers of this sputtering material can be deposited homogenously, this homogeneity decreases continuously as the duration of bombardment, and thus the consumption of the sputtering target increases. Thus, unvarying layer properties cannot be ensured.

BRIEF SUMMARY OF THE INVENTION

Therefore, the object of the present invention is to provide a sputtering target that ensures the production of layers of the sputtering material having unvarying homogeneity during the lifespan of the sputtering target.

This object is achieved by a sputtering target having a mixture of oxides of indium, zinc, and gallium, containing at least one ternary mixed oxide of indium, zinc, and gallium, wherein the portion of ternary mixed oxides of indium, zinc, and gallium is at least 50 weight percent relative to the total weight of the mixture, and the portion of amorphous phase is at least 20 weight percent relative to the total weight of the mixture.

In addition, the present invention provides a method for manufacturing this sputtering target, in which:

(i) a mixture of particles is provided having an average particle diameter in the range of 15-300 µm, wherein the mixture comprises oxides of indium, zinc, and gallium and includes at least one mixed oxide selected from the group of binary and ternary mixed oxides of indium, zinc, and gallium;

(ii) the particles are heated to a temperature in the range of 1500° C. to 2300° C. within a time period of not more than 10 ms; and (iii) the mixture is cooled to a temperature of not more than 300° C. during a time period of not more than 10 ms.

The present invention is based on the surprising finding that during the sputtering of indium-gallium-zinc mixed oxides, layers having unvarying homogeneity can be produced, if the sputtering target contains a high portion of ternary indium-gallium-zinc mixed oxides and simultaneously has a high portion of amorphous phase. If the indium-gallium-zinc mixed oxides also contain a crystalline portion, it has surprisingly turned out to be advantageous for the improvement of the sputtering properties that this crystalline portion have an average crystal size in the range of 10-30 nm, and is therefore formed as microcrystalline phase.

Surprisingly, it was determined that sputtering targets having these properties can be easily obtained, if mixtures comprising binary and/or ternary mixed oxides of indium, zinc, and gallium are heated with a steep temperature gradient to a temperature in the range of 1500-2300° C. and are subsequently cooled with a steep temperature gradient. It was discovered that in the rapid heating and rapid cooling of these mixtures of oxides of indium, zinc, and gallium a thermodynamic disequilibrium having a high portion of ternary indium-gallium-zinc mixed oxides can be formed and preserved. Surprisingly, here not only was a mixture having a high portion of ternary indium-gallium-zinc mixed oxides obtained, but this mixture additionally contained a high portion of amorphous phase. According to the present invention, in this way a sputtering target is provided.

This sputtering target has a mixture of oxides of indium, zinc, and gallium. The sputtering target can consist of this mixture. On the other hand, this mixture can also be arranged on a carrier. The carrier can, for example, be made of high-grade steel. During sputter deposition, this carrier conventionally acts as the cathode. According to a preferred embodiment, this cathode is a planar cathode or is a tube cathode. According to a particularly preferred embodiment, the cathode is a tube cathode. Optionally, in addition to the carrier and the mixture the sputtering target can have further components, in particular additional layers which can be arranged, for example, between the carrier and the mixture.

DETAILED DESCRIPTION OF THE INVENTION

A "mixture of oxides of indium, zinc, and gallium" is to be understood as a composition having oxides of indium, zinc, and gallium, in which these oxides can in principle be present as single oxides, binary mixed oxides, or ternary mixed oxides of indium, zinc, and gallium. The term "mixture of oxides of indium, zinc, and gallium" does not necessarily presuppose the presence of oxides of indium, zinc, and gallium with different compositions, but rather also includes, for example, a composition consisting only of a ternary mixed oxide of indium, zinc, and gallium. Here, this ternary mixed oxide is in equal measure an oxide of indium, oxide of zinc, and oxide of gallium, and thus represents a mixture of these oxides.

Accordingly, in principle the term "mixture of oxides of indium, zinc, and gallium" includes, for example, a composition consisting of an indium-gallium-zinc mixed oxide as a ternary mixed oxide, a composition containing indium oxide, zinc oxide, and gallium oxide as single oxides, a composition containing zinc oxide as a single oxide and indium-gallium mixed oxide as a binary mixed oxide, or a composition containing indium-gallium mixed oxide and indium-zinc mixed oxide as a binary mixed oxide.

According to the present invention, the mixture contains at least one ternary mixed oxide having indium, zinc, and gallium.

According to a preferred embodiment, a mixed oxide is understood as a mixed crystal. This mixed crystal has oxygen as one of its components.

In the present application, a ternary mixed oxide is to be understood as a mixed oxide having indium, gallium, and zinc. Preferably, the mixture contains a plurality of ternary mixed oxides differing in their content of indium, gallium, and zinc. According to a preferred embodiment, the mixture contains at least $InGaZnO_4$ as mixed oxide.

The portion of ternary mixed oxides having indium, zinc, and gallium is at least 50 weight percent, preferably at least 60 weight percent, more preferably at least 70 weight percent, still more preferably at least 80 weight percent, particularly preferably at least 85 weight percent, most particularly preferably at least 90 weight percent, and in particular at least 95 weight percent, relative to the total weight of the mixture.

The portion of ternary mixed oxides having indium, zinc, and gallium is preferably in the range of 20-100 weight percent, thus for example in the range of 25-99 weight percent, in the range of 35-98 weight percent, in the range of 40-97 weight percent, or in the range of 45-95 weight percent, relative to the total weight of the mixture.

According to a preferred embodiment, the portion of $InGaZnO_4$ is in the range of 20-95 weight percent, for example in the range of 20-90 weight percent or in the range of 25-80 weight percent, relative to the total weight of the mixture.

In addition to the at least one ternary mixed oxide, the mixture can also contain at least one binary mixed oxide or single oxides.

Binary mixed oxides are to be understood as oxides having indium and zinc, oxides having indium and gallium, and oxides having zinc and gallium. According to a preferred embodiment, the mixture contains at least $InGaO_3$ as binary mixed oxide.

According to the present invention, single oxides are to be understood as indium oxides, gallium oxides, and zinc oxides. For example, the mixture can contain $In_2O_3$, indium oxide, as a single oxide.

Preferably, the mixture comprises less than 30 weight percent, more preferably less than 20 weight percent, still more preferably less than 10 weight percent, and particularly preferably less than 5 weight percent of oxides selected from the group consisting of single oxides and binary mixed oxides, relative to the total weight of the mixture.

According to a particularly preferred embodiment, the ratio of single oxides to ternary mixed oxides is in the range of 0-1, still more preferably in the range of 0.02-0.2.

Single oxides, binary mixed oxides, or ternary mixed oxides of indium, zinc, and gallium can be qualitatively identified in a manner known to those skilled in the art, and their portion in a mixture of oxides of indium, zinc, and gallium can be quantitatively determined in a manner known to those skilled in the art. For example, for this purpose one may proceed in the manner described in the textbook "*Fundamentals of Powder Diffraction and Structural Characterization of Materials*" (V. Pecharsky and P. Zavalij, 2nd edition, Springer Verlag 2009, ISBN 978-0-387-09578-3), in which a method for the qualitative and quantitative determination of individual phases is given in Chapter 13.3, *"Phase Identification and Quant. Analysis,"* pp. 377-399.

According to the present invention, the mixture also has an amorphous phase.

An amorphous phase is understood as a phase in which the atoms do not form ordered structures, but rather form an irregular pattern, and have only short-range order, but not long-range order.

According to a preferred embodiment, an amorphous phase is understood as a roentgen-amorphous phase. Roentgen-amorphous phases are phases that do not yield sharp interferences, but rather only diffuse interferences, at small roentgen diffraction angles.

The portion of amorphous phase is at least 20 weight percent, more preferably at least 21 weight percent, still more preferably at least 22 weight percent, particularly preferably at least 23 weight percent, and most particularly preferably at least 24 weight percent, relative to the total weight of the mixture.

The portion of amorphous phase is preferably in the range of 20-100 weight percent, thus for example in the range of 21-99 weight percent, in the range of 22-95 weight percent, in the range of 23-95 weight percent, or in the range of 24-90 weight percent, relative to the total weight of the mixture.

According to a particularly preferred embodiment, the portion of amorphous phase is at least 20 weight percent, more preferably at least 21 weight percent, still more preferably at least 22 weight percent, particularly preferably at least 23 weight percent, and most particularly preferably at least 24 weight percent, relative to the total weight of the ternary mixed oxides.

According to a further particularly preferred embodiment, the portion of amorphous phase is in the range of 20-100 weight percent, for example in the range of 21-99 weight percent, in the range of 22-95 weight percent, in the range of 23-95 weight percent, or in the range of 24-90 weight percent, relative to the total weight of the ternary mixed oxides.

The amorphous phase can be qualitatively identified and its portion in a mixture can be quantitatively determined in a manner known to those skilled in the art. For example, for this purpose one may use the method of analysis according to Rietveld, as described in detail in *"Powder Diffraction, Theory and Practice"* (R. Dinnebier and S. Billinge, RSC Publishing, ed. Royal Soc. Chemistry, London, 2008, ISBN 978-0-85404-231-9), for example by Madsen and Scarlett in Chapter 11 ("*Quantitative Phase Analysis*"), p. 328ff.

In addition to an amorphous phase, the mixture of oxides of indium, zinc, and gallium can also have crystalline phases.

These crystalline phases are preferably microcrystalline phases. Accordingly, the mixture preferably additionally contains microcrystalline phases of oxides of indium, zinc, and gallium.

Microcrystalline phases are to be understood as phases having crystals having average crystallite sizes in the range of 10-30 nm, and preferably in the range of 12-28 nm.

According to a preferred embodiment, the portion of microcrystalline phases is in the range of 0-80 weight percent, thus for example in the range of 1-79 weight percent, in the range of 5-78 weight percent, or in the range of 10-76 weight percent, relative to the total weight of the mixture.

According to a particularly preferred embodiment, the mixture contains only a small portion of crystalline phases having crystals having crystallite sizes larger than 30 nm. Preferably, the portion of such crystalline phases is at most 24 weight percent, more preferably at most 22 weight percent, still more preferably at most 20 weight percent, particularly preferably at most 18 weight percent, most particularly preferably at most 16 weight percent, and in particular at most 15 weight percent, relative to the total weight of the mixture.

According to a further particularly preferred embodiment, the weight ratio of crystalline phases to amorphous phase is in the range of 0-15, thus for example in the range of 0.5-15, in the range of 1-10, in the range of 2-8, or in the range of 3-6.

According to another particularly preferred embodiment, the weight ratio of microcrystalline phases to amorphous phase is in the range of 0-15, thus for example in the range of 0.5-15, in the range of 1-10, in the range of 2-8, or in the range of 3-6.

The determination of the crystallite size and of the portion of microcrystalline phase or crystalline phase can take place in a manner known to those skilled in the art. For example, for this purpose one may use the method of analysis according to Rietveld, as described in detail in "*Powder Diffraction, Theory and Practice*" (R. Dinnebier and S. Billinge, RSC Publishing, ed. Royal Soc. Chemistry, London, 2008, ISBN 978-0-85404-231-9), for example by Scardi in Chapter 13 ("*Lattice Defects and Domain Size Effects*"), p. 376ff.

There is no particular limitation on the portion of indium, zinc, and gallium in the mixture. Preferably, however, the ratio of indium:zinc:gallium in the mixture is 0.8-2.2:0.8-2.2:1 atom %. According to a first particularly preferred embodiment, indium:zinc:gallium are present in the mixture in a ratio of 0.8-1.2:0.8-1.2:1 atom %. According to a second particularly preferred embodiment, indium:zinc:gallium are present in the mixture in a ratio of 1.8-2.2:1.8-2.2:1 atom %.

The sputtering target according to the present invention can be obtained by heating a particular particle mixture within a short time interval and subsequently cooling it within a short time interval.

For this purpose, first a mixture is provided of particles having an average particle diameter in the range of 15-300 μm, wherein the mixture comprises oxides of indium, zinc, and gallium. According to the present invention, this mixture comprises at least one mixed oxide selected from the group consisting of binary and ternary mixed oxides of indium, zinc, and gallium.

Surprisingly, it has turned out that mixtures having a high portion of ternary mixed oxides and a high portion of amorphous phase can be obtained through the method described herein, only if for this purpose a particle mixture is used that already contains binary mixed oxides, ternary mixed oxides, or binary and ternary mixed oxides.

Accordingly, this particle mixture used for the production method preferably comprises (i) mixtures of at least two binary mixed oxides of indium, zinc, and gallium, (ii) at least one ternary mixed oxide of indium, zinc, and gallium, (iii) mixtures of at least one single oxide of indium, zinc, and gallium with at least one such binary mixed oxide, (iv) mixtures of at least one such single oxide with at least one such ternary mixed oxide, (v) mixtures of at least one such binary mixed oxide with at least one such ternary mixed oxide, or (vi) combinations of at least two of the mixtures (i) through (v).

According to a preferred embodiment, the individual particles of the particle mixture already contain the above-named oxides of indium, zinc, and gallium. According to this embodiment, the particle mixture can be a homogenous mixture of particles having the same composition.

According to a further preferred embodiment, the particle mixture is a heterogeneous mixture of particles having different composition.

According to a particularly preferred embodiment, the portion of at least one mixed oxide selected from the group consisting of binary and ternary mixed oxides of indium, zinc, and gallium is at least 5 weight percent, more preferably at least 10 weight percent, still more preferably at least 15 weight percent, particularly preferably at least 20 weight percent, most particularly preferably at least 30 weight percent, and in particular at least 40 weight percent, relative to the total weight of the particle mixture.

The particles of this mixture preferably have an average particle diameter in the range of 20-250 μm, still more preferably in the range of 30-200 μm.

"Average particle diameter" is preferably to be understood as the particle diameter assumed by at least 90% of the particles.

However, it is preferred that at least 99%, and still more preferably 100%, of the particles assume this particle diameter.

According to a first embodiment, this particle mixture can be obtained directly from a suspension with the use of an agglomeration process.

For this purpose, first a suspension is provided containing at least an oxide of indium, an oxide of zinc, and an oxide of gallium.

In the scope of the present invention, a "suspension containing at least an oxide of indium, an oxide of zinc, and an oxide of gallium" is thus understood as including a suspension containing binary and/or ternary mixed oxides of these elements. For example, in the present case a binary mixed oxide of indium and zinc is equally regarded as an oxide of indium and as an oxide of zinc.

According to a particularly preferred embodiment, this suspension contains $In_2O_3$, $Ga_2O_3$, and ZnO.

In order to produce the suspension, powders of the oxides of indium, zinc, and gallium contained in the suspension are preferably introduced into a dispersion medium. Water is preferably used as dispersion medium.

The primary particles contained in the powder used to produce the suspension preferably have an average particle diameter in the range of 0.1-10 μm, more preferably in the range of 0.1-3 μm.

According to a preferred embodiment, the average particle diameter of the primary particles of $In_2O_3$ is in the range of 0.5-5 μm, more preferably in the range of 0.5-3 μm.

The average particle diameter of the primary particles of $Ga_2O_3$ is preferably in the range of 0.5-5 µm, more preferably in the range of 0.5-3 µm.

The average particle diameter of the primary particles of ZnO is preferably in the range of 0.2-4 µm, more preferably in the range of 0.5-2 µm.

According to a particularly preferred embodiment, this suspension contains 39-51 weight percent $In_2O_3$, 14-46 weight percent $Ga_2O_3$, and 13-35 weight percent ZnO, relative to the weight of the solid materials contained in the suspension.

According to a most particularly preferred embodiment, the suspension contains 44-51 weight percent $In_2O_3$, 14-26 weight percent $Ga_2O_3$, and 29-35 weight percent ZnO, relative to the weight of the solid materials contained in the suspension.

In addition to the oxides of indium, zinc, and gallium, as well as dispersion medium, the suspension can contain further constituents, in particular binders, dispersants, and/or deflocculants. Polyvinyl acetate may for example be used as a binder.

The portion of solid materials in the suspension is preferably 40-90 weight percent, more preferably 50-80 weight percent, relative to the total weight of the suspension.

After the introduction into the dispersion medium of the powders of the oxides of indium, zinc, and gallium, as well as optional further constituents, a treatment step is preferably carried out, which ensures further pulverization of the powders. For this purpose, the suspension can for example undergo a treatment in a high energy mill.

In a next step, the oxides contained in the suspension can be agglomerated. This step serves to create a cohesion between the fine oxide particles and thereby to improve their processability. For this purpose, the agglomeration methods known from the prior art may be used. For example, the oxides contained in the suspension can be subjected to a spray agglomeration or to a fluidized-bed agglomeration. Alternatively, the oxides can be precipitated to achieve the agglomeration, or can be agglomerated by evaporating the dispersion medium and optional further constituents, for example in a rotary evaporator.

Preferably, the agglomeration conditions are selected such that agglomerates are formed having an average particle diameter of 15-300 µm, more preferably having an average particle diameter of 30-200 µm.

In addition, it is possible to pulverize the agglomerates after the agglomeration method has been carried out, in order to correspondingly reduce the particle size of the agglomerates.

Subsequently or also alternatively thereto, the agglomerates can be sorted in order to obtain particles having an average particle diameter in the range of 15-300 µm. The sorting can take place in a conventional manner through screening or sifting.

According to a particularly preferred embodiment, in a next, optional step, the obtained agglomerates can be pre-sintered.

Pre-sintering is to be understood here as a thermal treatment. This thermal treatment is used to accelerate diffusion processes between the atoms contained in the agglomerates. Preferably, the pre-sintering takes place under conditions that permit a conversion of at least a portion of the single oxides of indium, zinc, and gallium into corresponding binary or ternary mixed oxides. This pre-sintering can take place until a thermodynamic equilibrium has arisen between the single oxides of indium, zinc, and gallium, as well as the corresponding binary or ternary mixed oxides. In addition, during the pre-sintering the surface of the agglomerates, relative to the mass, is reduced overall compared to the agglomerates present before the pre-sintering.

Surprisingly, it has been determined that the pre-sintering has an advantageous effect on the quality of the ultimately produced sputtering target. As described below, the mixture of oxides of indium, zinc, and gallium of the sputtering target can be obtained according to the present invention by rapid heating and subsequent rapid cooling. Due to the high partial pressure of the single oxides, a depletion of the single oxides usually takes place here, which can affect the thermal equilibrium between the single oxides, the binary mixed oxides, and the ternary mixed oxides, thus lowering the quality of the oxide mixture of the sputtering target. Through the pre-sintering, the single oxides are at least already partially converted into the corresponding binary mixed oxides and ternary mixed oxides, which have a higher partial pressure, so that the above-described phenomenon can be significantly suppressed. This has the surprising consequence that, in the ultimately obtained oxide mixture of the sputtering target, a higher portion of ternary mixed oxides and a higher portion of amorphous and microcrystalline phases are to be found.

The pre-sintering preferably takes place at a temperature in the range of 800-1600° C., more preferably at a temperature in the range of 1000-1500° C.

The sintering duration during the pre-sintering is preferably 1-5 hr, more preferably 1-3 hr.

The pre-sintering preferably takes place in an air atmosphere or oxygen atmosphere.

The pre-sintered agglomerates are subsequently optionally pulverized, in order to correspondingly reduce the particle size of the pre-sintered agglomerates.

Subsequently or alternatively thereto, the pre-sintered agglomerates are sorted, in order to obtain particles having an average particle diameter in the range of 15-300 µm. Again, the sorting can take place in a conventional manner by screening or sifting.

According to a second embodiment, the mixture of particles is produced by pulverization of a corresponding solid material.

For this purpose, first a solid material is provided containing a mixture of oxides of indium, zinc, and gallium. This mixture includes at least one mixed oxide selected from the group consisting of binary and ternary mixed oxides of indium, zinc, and gallium.

It can be advantageous that the portion of at least one oxide selected from the group consisting of binary and ternary mixed oxides of indium, zinc, and gallium is at least 5 weight percent, more preferably at least 10 weight percent, still more preferably at least 15 weight percent, particularly preferably at least 20 weight percent, most particularly preferably at least 30 weight percent, and in particular at least 40 weight percent, relative to the total weight of the solid material.

This solid material can be, for example, recycled material.

This solid material can, for example, be obtained in that a suspension containing at least an oxide of indium, an oxide of zinc, and an oxide of gallium is first provided and is subsequently agglomerated. In this connection, reference is made to the explanations given above.

In a next step, the obtained agglomerates are preferably pressed. This can take place, for example, at a pressing pressure in the range of 25-30 Mpa.

Subsequently, the pressed agglomerates can be pre-sintered, preferably under the above-described conditions, in order to obtain a solid material containing a mixture of oxides of indium, zinc, and gallium, wherein the solid material comprises at least one mixed oxide selected from the group consisting of binary and ternary mixed oxides of indium, zinc, and gallium.

The solid material can subsequently be pulverized. The pulverization can take place, for example, by grinding the solid material in a known manner.

Subsequently, the pulverized solid material is finally preferably sorted in order to obtain particles having an average particle diameter in the range of 15-300 μm. The sorting can take place in a conventional manner by screening or sifting.

In a next step, the particles of the mixture are heated. During the heating, the particles are preferably sintered.

The sintering preferably takes place under conditions that permit the production of a thermodynamic equilibrium between the single oxides of indium, zinc, and gallium and the corresponding binary and ternary mixed oxides, but that also at least already permit the formation of ternary mixed oxides.

According to a preferred embodiment, here a mixture is produced of oxides of indium, zinc, and gallium, wherein the portion of ternary mixed oxides having indium, zinc, and gallium is at least 50 weight percent, relative to the total weight of the mixture.

According to a particularly preferred embodiment, the heated mixture has a composition, with regard to the single oxides, binary mixed oxides or ternary mixed oxides of indium, zinc, and gallium, in particular a portion of ternary mixed oxides, which is the same as that of the ultimately obtained mixture of the sputtering target.

For this purpose, the particles are heated to a temperature in the range of 1500-2300° C., preferably to a temperature in the range of 1600-2300° C., still more preferably to a temperature in the range of 1650-2200° C.

This heating takes place for a time duration of not more than 10 ms. Preferably, the heating takes place for a time duration of 0 ms-10 ms, more preferably a time duration of 10 μs-9 ms, still more preferably a time duration of 1 ms-8 ms.

According to a preferred embodiment, for the heating the particles are brought into a hot zone having a temperature in the range of 3000-20,000° C., more preferably in the range of 10,000-15,000° C. In this hot zone, the particles are heated to the sought temperature, and remain there at this temperature for the above-indicated period of time.

Immediately following the heating, the mixture is cooled.

The cooling takes place from the above-named temperature in the range of 1500° C. to 2300° C. to a temperature of not more than 300° C., within a time period of not more than 10 ms.

Preferably, the cooling takes place for a time duration of 0 ms-10 ms, more preferably for a time duration of 10 μs-9 ms, and still more preferably for a time duration of 1 ms-8 ms.

The cooling preferably takes place on a carrier. According to a preferred embodiment, this carrier is a cathode, in particular a tube cathode.

Here, the carrier is preferably cooled separately, in order to ensure that the cooling of the mixture to the required temperature of not more than 300° C. can take place in a time period of not more than 10 ms.

The heating and the cooling under these conditions produces a thermodynamic disequilibrium between the single oxides, the binary mixed oxides, and the ternary mixed oxides of indium, zinc, and gallium, which is shifted toward the ternary mixed oxides.

Surprisingly, it has been determined that by heating and cooling under these conditions a thermodynamic disequilibrium can be produced and preserved between the single oxides, the binary mixed oxides, and the ternary mixed oxides of indium, zinc, and gallium, which is shifted toward the ternary mixed oxides. The phase composition of this mixture differs significantly from the phase composition of mixtures obtained through slow heating to the above-named temperature or through rapid heating to the above-named temperature with a comparable temperature gradient, but with a subsequent slow cooling. Such mixtures do in fact also have ternary mixed oxides. However, these are in a thermodynamic equilibrium with single oxides and binary mixed oxides of indium, zinc, and gallium, which is shifted significantly toward these single oxides and binary mixed oxides.

In addition, it was determined that the mixture produced using the described method has a surprisingly high portion of amorphous phases in comparison with mixtures produced by slow heating or cooling of a mixture of oxides of indium, zinc, and gallium.

According to a preferred embodiment, the heating of the particles and the cooling of the mixture is realized in a thermal spraying method.

Thermal spraying methods that may be used here include, for example, flame spraying (for example using an acetylene-oxygen flame), high-speed flame spraying, detonation spraying, and plasma spraying.

According to a particularly preferred embodiment, the heating of the particles and the quenching of the mixture are realized in a plasma spraying method.

Here, the heating of the particles is preferably accomplished using a plasma torch.

Conventionally, in a plasma torch anode(s) and cathode(s) are separated by a narrow gap. Using a direct voltage, one or more arcs are produced between the anodes and the cathodes. Through the plasma torch there flows a gas or gas mixture that is conducted through the arc or arcs and is thus ionized. In this way, a highly heated electrically conductive gas made up of positively charged ions and electrons, known as a plasma stream, is produced. The particles are conventionally introduced, for example injected, into this plasma stream.

Accordingly, the heating of the particles according to the present invention preferably takes place in this plasma stream.

This plasma stream preferably carries the mixture of particles along with it and conveys the heated mixture to the carrier that is to be equipped. This plasma spraying method can take place, for example, in a normal atmosphere, in a vacuum, or under an inert atmosphere, in particular in the presence of a protective gas such as argon.

EXAMPLES

The following examples are intended to explain the present invention, and are not to be understood as limiting.

Example 1

A powder mixture was provided containing indium oxide ($In_2O_3$), gallium oxide ($Ga_2O_3$), and zinc oxide (ZnO), wherein the ratio of indium to gallium to zinc was 2:2:1 (in atom %), relative to the metal portions. This powder mixture was dispersed in water, wherein the solid portion was 60 weight percent. Subsequently, a binder (PVA) was added to the obtained suspension. The slurry obtained in this way was spray-agglomerated. The resulting agglomerates were pressed in order to obtain a solid material containing a mixture of oxides of indium, zinc, and gallium. This solid material was pre-sintered in air at a temperature of 1600° C. In an impact mill, the pre-sintered solid material was pulverized and fractionated by screening. For the rest of the method, a fraction was selected having an average particle diameter of 45-125 μm.

This mixture of particles of indium, zinc, and gallium, containing binary or ternary mixed oxides and having an average particle diameter of 45-125 μm, was then subjected to a plasma spraying method. The conveying capacity of the plasma torch was 100 g/min at a plasma power of 70 kW. here, the plasma torch was multiply moved with constant path speed over a rotating stainless steel tube, whereby the heated mixture was deposited layer on layer.

The sputtering target produced in this way had a mixture of oxides of indium, zinc, and gallium. The portion of ternary mixed oxides was more than 50 weight percent, relative to the total weight of the mixture. In addition to ternary mixed oxides, smaller portions were also present of the binary mixed oxide $InGaO_3$ and the single oxide $In_2O_3$. The portion of amorphous phases was 24 weight percent, relative to the total weight of the mixture. In addition, the mixture also contained microcrystalline phases having a crystal size of 10-30 nm.

The sputtering target was subsequently used for a sputter deposition. It turned out that homogenous layers were able to be deposited continuously from the sputtering material up to the complete erosion of the mixture. The deposited layers showed no inhomogeneities, in particular no nodules.

Comparison Example 1

The procedure of Example 1 was followed, but wherein the particle mixture was sintered for a time period of several hours and was subsequently slowly cooled.

The phase composition of the obtained mixture differed significantly from the phase composition of the mixture according to the example of the present invention. In particular, the portion of amorphous phases was only 3 weight percent.

The sputtering target obtained in this way was used for a sputter deposition. It turned out that at first it was possible to deposit homogenous layers from the sputtering material. However, as the erosion of the sputtering material increased, the deposited layers often showed inhomogeneities, in particular nodules.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A sputtering target comprising a mixture of oxides of indium, zinc, and gallium, the mixture containing at least one ternary mixed oxide of indium, zinc, and gallium and at least one amorphous phase, wherein the portion of ternary mixed oxide of indium, zinc, and gallium is at least 50 weight percent, relative to the total weight of the mixture, and the portion of amorphous phase is 20 to 90 weight percent, relative to the total weight of the mixture.

2. The sputtering target according to claim 1, wherein a ratio based on atom percent of indium:zinc:gallium in the mixture is in a range of 0.8-2.2:0.8-2.2:1.

3. The sputtering target according to claim 1, wherein the mixture is arranged on a carrier.

4. The sputtering target according to claim 3, wherein the carrier is a tube cathode.

* * * * *